United States Patent
Zhou (10) Patent No.: US 11,049,428 B1
(45) Date of Patent: Jun. 29, 2021

(54) DRIVING CIRCUIT AND DISPLAY PANEL (71) Applicant: WUHAN CHINA STAR OPTOELECTRONICS TECHNOLOGY CO., LTD, Hubei (CN)

(72) Inventor: Yongxiang Zhou, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/753,862

(22) PCT Filed: Mar. 11, 2020

(86) PCT No.: PCT/CN2020/078703
§ 371 (c)(1),
(2) Date: Apr. 6, 2020

(51) Int. Cl.
*G09G 3/20* (2006.01)
*G06K 9/00* (2006.01)

(52) U.S. Cl.
CPC ............ *G09G 3/20* (2013.01); *G06K 9/0004* (2013.01); *G06K 9/001* (2013.01); *G09G 2300/08* (2013.01); *G09G 2310/0243* (2013.01); *G09G 2310/0267* (2013.01); *G09G 2310/0281* (2013.01); *G09G 2310/0283* (2013.01); *G09G 2310/08* (2013.01); *G09G 2320/0252* (2013.01)

(58) Field of Classification Search
CPC ............ G09G 2310/0286; G09G 3/20; G09G 2300/0809; G09G 2310/0281; G09G 2310/0283; G06F 3/04166
See application file for complete search history.

(56) References Cited

U.S. PATENT DOCUMENTS

| | | | |
|---|---|---|---|
| 2017/0102801 A1* | 4/2017 | Ko | G06F 3/04166 |
| 2017/0124969 A1* | 5/2017 | Dai | G09G 3/3648 |
| 2017/0345516 A1* | 11/2017 | Choi | G11C 19/287 |
| 2019/0163001 A1 | 5/2019 | Gong | |
| 2019/0220645 A1 | 7/2019 | Ding et al. | |
| 2020/0226341 A1* | 7/2020 | He | H01L 27/323 |

FOREIGN PATENT DOCUMENTS

| | | |
|---|---|---|
| CN | 106919927 A | 7/2017 |
| CN | 107450215 A | 12/2017 |
| CN | 107633833 A | 1/2018 |
| CN | 108010498 A | 5/2018 |
| KR | 20080083409 A | 9/2008 |

* cited by examiner

Primary Examiner — Gerald Johnson
(74) Attorney, Agent, or Firm — Mark M. Friedman (57) ABSTRACT

The present invention provides a driving circuit including multilevel cascading driving sub-circuits, wherein an Nth level driving sub-circuit includes a pull-up potential generating unit, a driving signal generating unit, a pull-down potential generating unit, and a driving signal pull-down unit. The driving circuit provided by the present invention separately outputs a display driving signal and fingerprint driving signals in a different timing through the driving signal generating unit, so that fingerprint driving circuits are not required, thereby reducing size of border regions occupied thereof.

19 Claims, 7 Drawing Sheets

DRIVING CIRCUIT AND DISPLAY PANEL

FIELD OF INVENTION

The present disclosure relates to the display technology field, and more particularly, to a driving circuit and a display panel.

BACKGROUND OF INVENTION

Presently, with rapid development of society and science and technology, electronic products such as mobile phones, computers, and televisions are widely applied in all aspects of life. Therefore, electronic display panels such as liquid crystal display panels and organic light-emitting diode (OLED) display panels are widely used, wherein fingerprint recognition is a common application, and with an application trend of full screen, fingerprint recognition modules have been integrated into panels. Moreover, in addition to original gate on array (GOA) circuits for the panels, driving circuits for fingerprint recognition also need to be disposed in the panels. This obviously needs to occupy more width of border regions of display panels, thereby increasing size of original border regions, which is inconsistent with development trend of narrow border regions of current full screens.

SUMMARY OF INVENTION

The present disclosure provides a driving circuit solving problems that fingerprint driving circuits need to be further disposed in display panels integrated with fingerprint recognition function, which increases width of border regions.

In a first aspect, the present disclosure provides a driving circuit comprising multilevel cascading driving sub-circuits, wherein an Nth level driving sub-circuit comprises a pull-up potential generating unit used to generate a pull-up potential signal, a driving signal generating unit connected to an output terminal of the pull-up potential generating unit and used to separately output a display driving signal and fingerprint driving signals according to the pull-up potential signal in a different timing, a pull-down potential generating unit used to generate a pull-down potential signal, and a driving signal pull-down unit connected to an output terminal of the pull-down potential generating unit and an output terminal of the driving signal generating unit, which is used to control the driving signal pull-down unit according to the pull-down potential signal to pull down a potential of the display driving signal and a potential of the fingerprint driving signals.

Based on the first aspect, in a first embodiment of the first aspect, the Nth level driving sub-circuit further comprises an anti-backflow protection unit, an input terminal of the anti-backflow protection unit is connected to the output terminal of the pull-up potential generating unit, an output terminal of the anti-backflow protection unit is connected to an input terminal of the driving signal generating unit, and a control terminal of the anti-backflow protection unit is connected to a constant high potential signal.

Based on the first aspect, in a second embodiment of the first aspect, the Nth level driving sub-circuit further comprises a pull-down unit, an input terminal of the pull-down unit is connected to a constant low potential signal, an output terminal of the pull-down unit is connected to the output terminal of the pull-up potential generating unit, and a control terminal of the pull-down unit is connected to the output terminal of the pull-down potential generating unit.

Based on the first aspect, in a third embodiment of the first aspect, the Nth level driving sub-circuit further comprises a reset unit, a system reset signal is connected to an input terminal of the reset unit and a control terminal of the reset unit, and an output terminal of the reset unit is connected to the output terminal of the pull-down potential generating unit.

Based on the first aspect, in a fourth embodiment of the first aspect, the Nth level driving sub-circuit further comprises a system setting signal, the system setting signal is connected to a control terminal of the system setting unit, an input terminal of the system setting unit is connected to the constant low potential signal, and an output terminal of the system setting unit is connected to an output terminal of the driving signal generating unit.

Based on the first aspect, in a fifth embodiment of the first aspect, the Nth level driving sub-circuit further comprises a system display setting unit, a control terminal of the system display setting unit is connected to a system display setting signal, an input terminal of the system display setting unit is connected to a constant low potential signal, and an output terminal of the system display setting unit is connected to the output terminal of the pull-down potential generating unit and the output terminal of the driving signal generating unit.

Based on the first aspect, in a sixth embodiment of the first aspect, the Nth level driving sub-circuit further comprises a reverse scanning control unit, the reverse scanning control unit is connected to the constant low potential signal, the pull-up potential generating unit, and the pull-down potential generating unit.

Based on any one of the above embodiments of the first aspect, in a seventh embodiment of the first aspect, the fingerprint driving signals comprise a fingerprint reset signal and a fingerprint enable signal, the fingerprint reset signal is used to control fingerprint recognition circuits to reset, and the fingerprint enable signal is used to control the fingerprint recognition circuits to output a fingerprint recognition signal.

In a second aspect, the present disclosure provides a display panel comprising the driving circuit in any one of the above embodiments.

Based on the second aspect, in a first embodiment of the second aspect, the display panel further comprises fingerprint recognition circuits integrated in the display panel, and a control terminal of the fingerprint recognition circuits is connected to an output terminal of the driving circuit to connect to fingerprint driving signals.

A driving circuit provided by the present disclosure separately outputs a display driving signal and fingerprint driving signals in a different timing through a driving signal generating unit, which can be respectively used for driving display and fingerprint recognition, so that fingerprint driving circuits are not required and driving circuit topological structures are simplified, thereby reducing size of border regions occupied thereof.

DETAILED DESCRIPTION OF PREFERRED EMBODIMENTS

In order to make purposes, technical solutions, and effects of the present disclosure clearer and more definite, following describes the present disclosure in detail with reference to the drawings and embodiments. It should be understood that specific embodiments described herein are only used to explain the present disclosure, and are not intended to limit the present disclosure.

Figure 1:
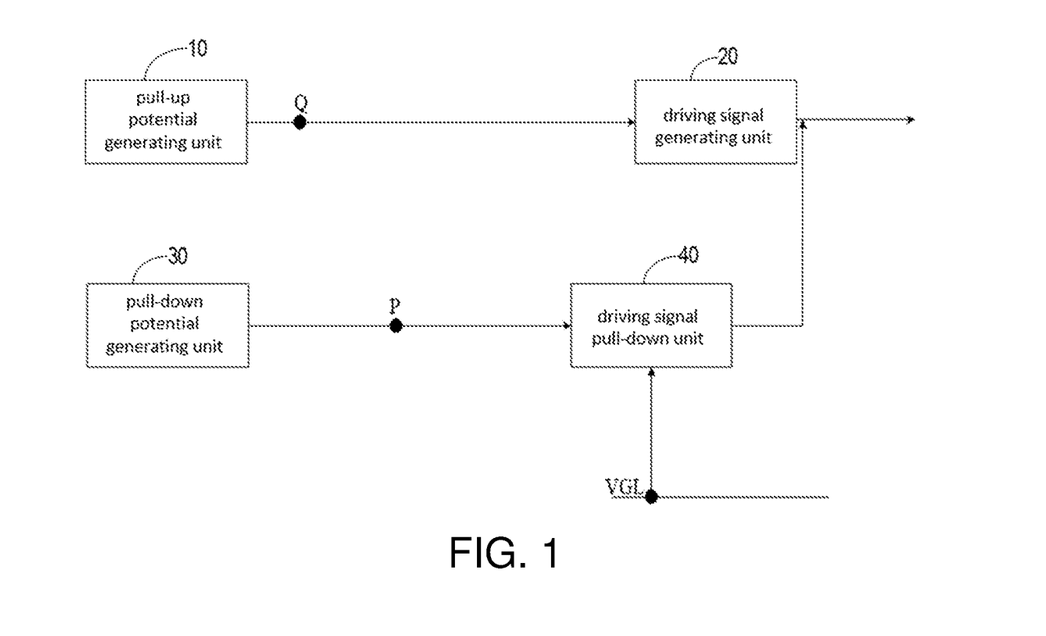
FIG. 1 is a first schematic structural diagram of a driving circuit provided by an embodiment of the present disclosure.

As shown in FIG. 1, a present embodiment provides a driving circuit comprising multilevel cascading driving sub-circuits, wherein an Nth level driving sub-circuit comprises a pull-up potential generating unit 10 used to generate a pull-up potential signal Q, a driving signal generating unit 20 connected to an output terminal of the pull-up potential generating unit 10 and used to separately output a display driving signal G(N) and fingerprint driving signals according to the pull-up potential signal Q in a different timing, a pull-down potential generating unit 30 used to generate a pull-down potential signal P, and a driving signal pull-down unit 40 connected to an output terminal of the pull-down potential generating unit 30 and an output terminal of the driving signal generating unit 20, which is used to control the driving signal pull-down unit 40 according to the pull-down potential signal P to pull down a potential of the display driving signal G(N) and a potential of the fingerprint driving signals.

Figure 8:
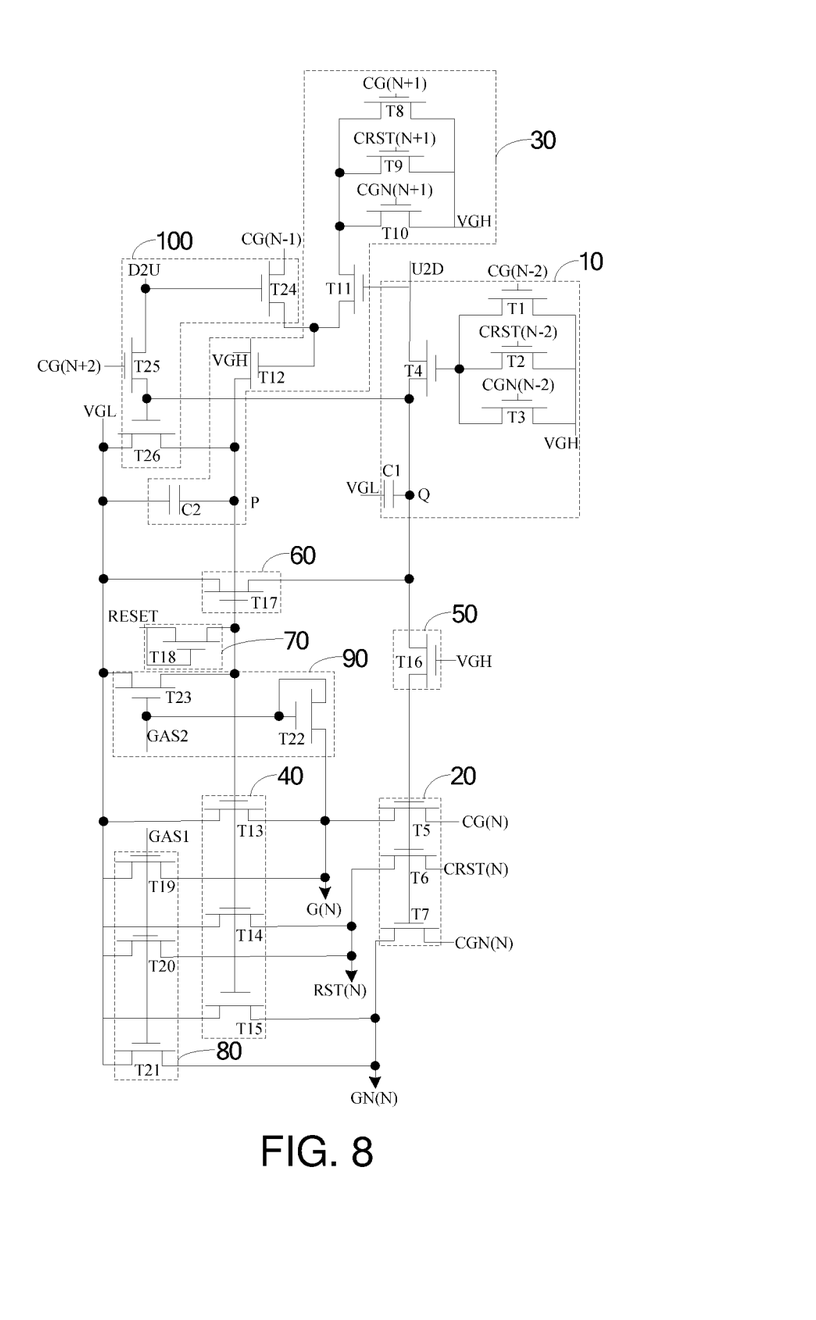
FIG. 8 is a schematic circuit diagram of the driving circuit shown in FIG. 7.

Specifically, as shown in FIG. 8, the pull-up generating unit 10 outputs the pull-up potential signal Q to the driving signal generating unit 20 and control the driving signal generating unit 20 to be in an operating state, thereby separately outputting the display driving signal G(N) and the fingerprint driving signals; that is, the display drive signal G(N) and the fingerprint driving signals are independent of each other and located in different time periods in timing. The pull-down potential generating unit 30 outputs the pull-down potential signal P to the driving signal pull-down unit 40, thereby pulling down the potentials of both the display driving signal G(N) and the fingerprint driving signals. Based on the above mentioned, the present disclosure separately outputs the display driving signal and the fingerprint driving signals in a different timing through the driving signal generating unit, which can be respectively used for driving display and fingerprint recognition, so that fingerprint driving circuits are not required and driving circuit topological structures are simplified, thereby reducing size of border regions occupied by thereof.

Wherein, as shown in FIG. 8, the pull-up potential generating unit 10 comprises a first thin film transistor T1, a second thin film transistor T2, a third thin film transistor T3, a fourth thin film transistor T4, and a first capacitor C1. A constant high potential signal VGH is connected to a drain of the first thin film transistor T1, a drain of the second thin film transistor T2, and a drain of the third thin film transistor T3. An (N−2)th level gate control signal CG(N−2) is connected to a gate of the first thin film transistor T1, an (N−2)th level fingerprint reset control signal CRST(N−2) is connected to a gate of the second thin film transistor T2, and an (N−2)th level fingerprint control signal CGN(N−2) is connected to a gate of the third thin film transistor T3. A gate of the fourth thin film transistor T4 is connected to a source of the first thin film transistor T1, a source of the second thin film transistor T2, and a source of the third thin film transistor T3. A forward scanning control signal U2D is connected to a drain of the fourth thin film transistor T4, a source of the fourth thin film transistor T4 is connected to a first terminal of the first capacitor C1, and a second terminal of the first capacitor C1 is connected to a constant low potential signal VGL.

Wherein, as shown in FIG. 8, the driving signal generating unit 20 comprises a fifth thin film transistor T5, a sixth thin film transistor T6, and a seventh thin film transistor T7. The first terminal of the first capacitor C1 is connected to a gate of the fifth thin film transistor T5, a gate of the sixth thin film transistor T6, and a gate of the seventh thin film transistor T7. An Nth level gate control signal CG(N) is connected to a drain of the fifth thin film transistor T5, and a source of the fifth thin film transistor T5 is used to output the display driving signal G(N). An Nth level fingerprint reset control signal CRST(N) is connected to a drain of the sixth thin film transistor T6, and a source of the sixth thin film transistor T6 is used to output a fingerprint reset signal of the fingerprint driving signals. An Nth level fingerprint control signal CGN(N) is connected to a drain of the seventh thin film transistor T7, and a source of the seventh thin film transistor T7 is used to output a fingerprint enable signal of the fingerprint driving signals.

Wherein, as shown in FIG. 8, the pull-down potential generating unit 30 comprises an eighth thin film transistor T8, a ninth thin film transistor T9, a tenth thin film transistor T10, an eleventh thin film transistor T11, a twelfth thin film transistor T12, and a second capacitor C2. The constant high potential signal VGH is connected to a drain of the eighth thin film transistor T8, a drain of the ninth thin film transistor T9, and a drain of the tenth thin film transistor T10. An (N+1)th level gate control signal CG(N+1) is connected to a gate of the eighth thin film transistor T8, an (N+1)th level fingerprint reset control signal CRST(N+1) is connected to a gate of the ninth thin film transistor T9, and an (N+1)th level fingerprint control signal CGN(N+1) is connected to a gate of the tenth thin film transistor T10. A drain of the eleventh thin film transistor T11 is connected to a source of the eighth thin film transistor T8, a source of the ninth thin film transistor T9, and a source of the tenth thin film transistor T10, the forward scanning control signal U2D is connected to a gate of the eleventh thin film transistor T11, and a source of the eleventh thin film transistor T11 is connected to a gate of the twelfth thin film transistor T12. The constant high potential signal VGH is connected to a drain of the twelfth thin film transistor T12, a source of the twelfth thin film transistor T12 is connected to a first terminal of the second capacitor C2, and a second terminal of the second capacitor C2 is connected to the constant low potential signal VGL.

Wherein, as shown in FIG. 8, the driving signal pull-down unit 40 comprises a thirteenth thin film transistor T13, a fourteenth thin film transistor T14, and a fifteenth thin film transistor T15. The first terminal of the second capacitor C2 is connected to a gate of the thirteenth thin film transistor T13, a gate of the fourteenth thin film transistor T14, and a gate of the fifteenth thin film transistor T15. A source of the thirteenth thin film transistor T13 is connected to the source of the fifth thin film transistor T5, a source of the fourteenth thin film transistor T14 is connected to the source of the sixth thin film transistor T6, a source of the fifteenth thin film transistor T15 is connected to the source of the seventh thin film transistor T7, and the constant low potential signal VGL is connected to a drain of the thirteenth thin film transistor T13, a drain of the fourteenth thin film transistor T14, and a drain of the fifteenth thin film transistor T15.

Figure 2:
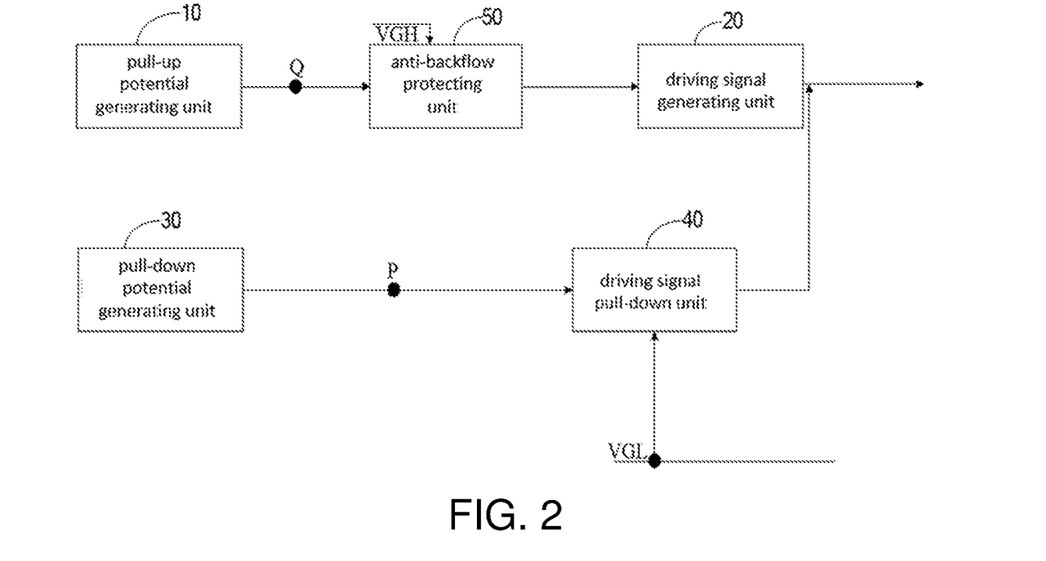
FIG. 2 is a second schematic structural diagram of the driving circuit provided by the embodiment of the present disclosure.

As shown in FIG. 2, in one of the embodiments, the Nth level driving sub-circuit further comprises an anti-backflow protection unit 50, an input terminal of the anti-backflow protection unit 50 is connected to the output terminal of the pull-up potential generating unit 10, an output terminal of the anti-backflow protection unit 50 is connected to an input terminal of the driving signal generating unit 20, and a control terminal of the anti-backflow protection unit 50 is connected to the constant high potential signal VGH.

Specifically, a function of the anti-backflow protection unit 50 is to prevent electric charge in the driving signal generating unit 20 from backflowing to driving circuits, which prevents potentials in the drive signal generating unit 20 from being affected.

Wherein, as shown in FIG. 8, the anti-backflow protection unit 50 comprises a sixteenth thin film transistor T16, the first terminal of the first capacitor C1 is connected to a drain of the sixteenth thin film transistor T16, a source of the sixteenth thin film transistor T16 is connected to the gate of the fifth thin film transistor T5, and a gate of the sixteenth thin film transistor T16 is connected to the constant high potential signal VGH.

Figure 3:
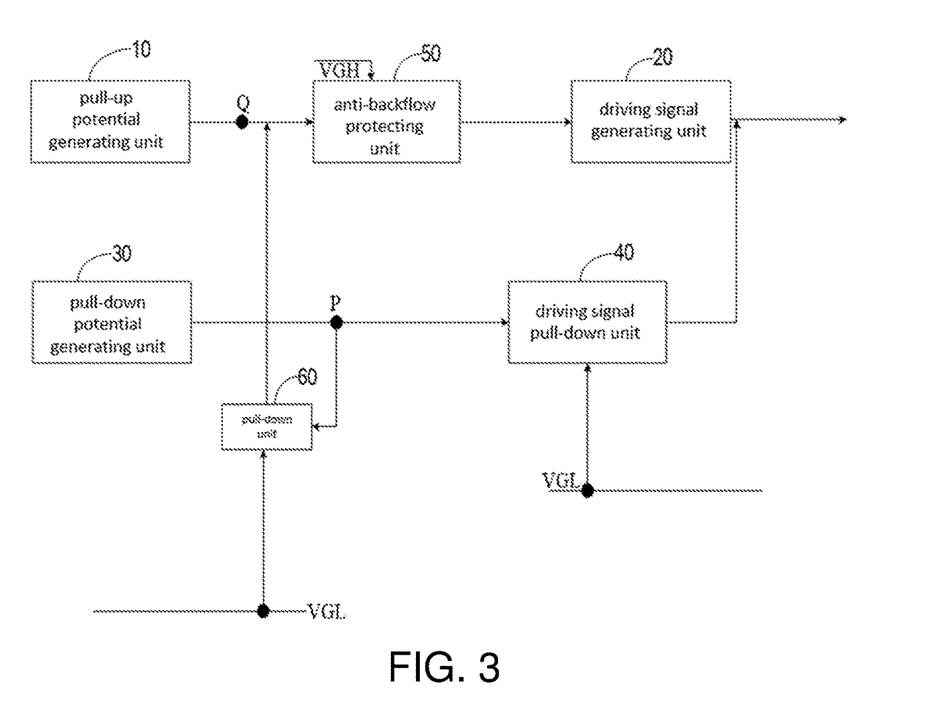
FIG. 3 is a third schematic structural diagram of the driving circuit provided by the embodiment of the present disclosure.

As shown in FIG. 3, in one of the embodiments, the Nth level driving sub-circuit further comprises a pull-down unit 60, an input terminal of the pull-down unit 60 is connected to the constant low potential signal VGL, an output terminal of the pull-down unit 60 is connected to the output terminal of the pull-up potential generating unit 10, and a control terminal of the pull-down unit 60 is connected to the output terminal of the pull-down potential generating unit 30.

Specifically, the pull-down unit 60 is used to pull down the pull-up potential signal Q according to the pull-down potential signal P, and then control the driving signal generating unit 20 to be in a non-operating state.

Wherein, as shown in FIG. 8, the pull-down unit 60 comprises a seventeenth thin film transistor T17, the first terminal of the second capacitor C2 is connected to a gate of the seventeenth thin film transistor T17, a source of the seventeenth thin film transistor T17 is connected to the first terminal of the first capacitor C1, and a drain of the seventeenth thin film transistor T17 is connected to the constant low potential signal VGL.

Figure 4:
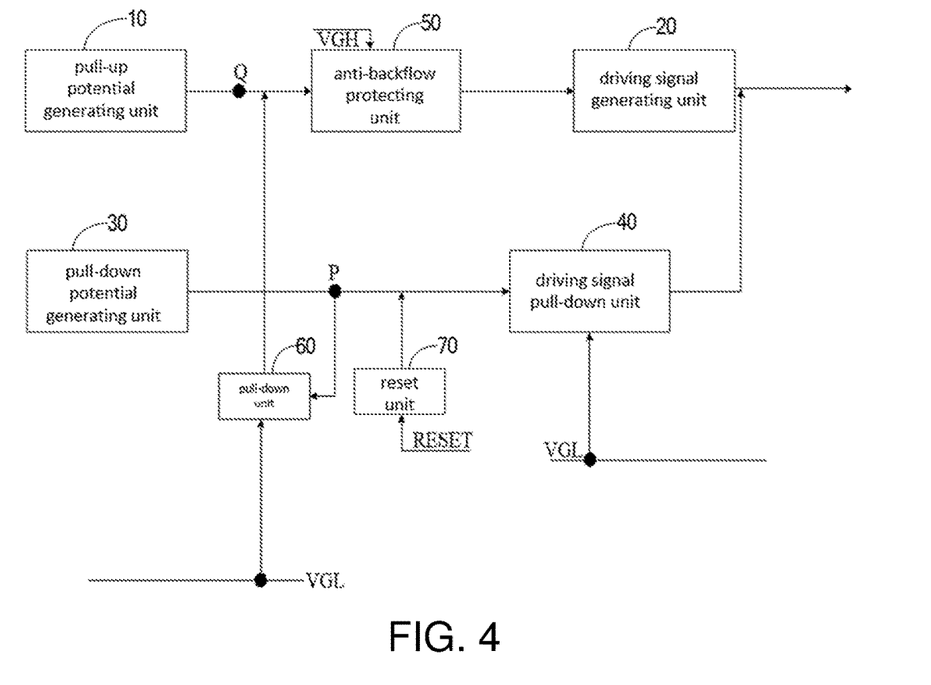
FIG. 4 is a fourth schematic structural diagram of the driving circuit provided by the embodiment of the present disclosure.

As shown in FIG. 4, in one of the embodiments, the Nth level driving sub-circuit further comprises a reset unit 70, a system reset signal RESET is connected to an input terminal of the reset unit 70 and a control terminal of the reset unit 70, and an output terminal of the reset unit 70 is connected to the output terminal of the pull-down potential generating unit 30.

Specifically, the reset unit 70 is used to pull up the pull-down potential signal P according to the system reset signal RESET. The system reset signal RESET is shared with an entire drive circuit; that is, the system reset signal RESET can reset all levels of the drive sub-circuits in the entire drive circuit at the same time.

Wherein, as shown in FIG. 8, the reset unit 70 comprises an eighteenth thin film transistor T18, the system reset signal RESET is connected to a drain of the eighteenth thin film transistor T18 and a gate of the eighteenth thin film transistor T18, and a source of the eighteenth thin film transistor T18 is connected to the first terminal of the second capacitor C2.

Figure 5:
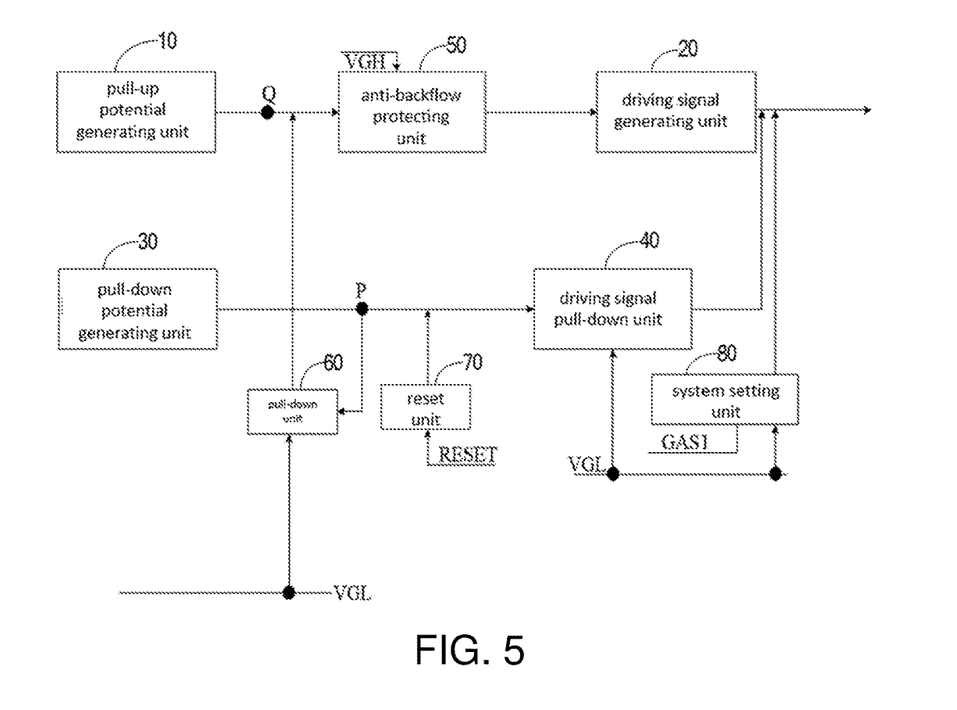
FIG. 5 is a fifth schematic structural diagram of the driving circuit provided by the embodiment of the present disclosure.

As shown in FIG. 5, in one of the embodiments, the Nth level driving sub-circuit further comprises a system setting unit 80, a system setting signal GAS1 is connected to a control terminal of the system setting unit 80, an input terminal of the system setting unit 80 is connected to the constant low potential signal VGL, and an output terminal of the system setting unit 80 is connected to an output terminal of the driving signal generating unit 20.

Specifically, the system setting unit 80 is used to pull down the display driving signal G(N) and the fingerprint driving signals according to the system setting signal GAS1. The system setting signal GAS1 is shared with the entire drive circuit; that is, the system set signal GAS1 can perform a system setting for all levels of the drive sub-circuits in the entire drive circuit at the same time.

Wherein, as shown in FIG. 8, the system setting unit 80 comprises a nineteenth thin film transistor T19, a twentieth thin film transistor T20, and a twenty-first thin film transistor T21. The system setting signal GAS1 is connected to a gate of the nineteenth thin film transistor T19, a gate of the twentieth thin film transistor T20, and a gate of the twenty-first thin film transistor T21. A source of the nineteenth thin film transistor T19 is connected to the source of the fifth thin film transistor T5, a source of the twentieth thin film transistor T20 is connected to the source of the sixth thin film transistor T6, and a source of the twenty-first thin film transistor T21 is connected to the source of the seventh thin film transistor T7. The constant low potential signal VGL is connected to a drain of the nineteenth thin film transistor T19, a drain of the twentieth thin film transistor T20, and a drain of the twenty-first thin film transistor T21.

Figure 6:
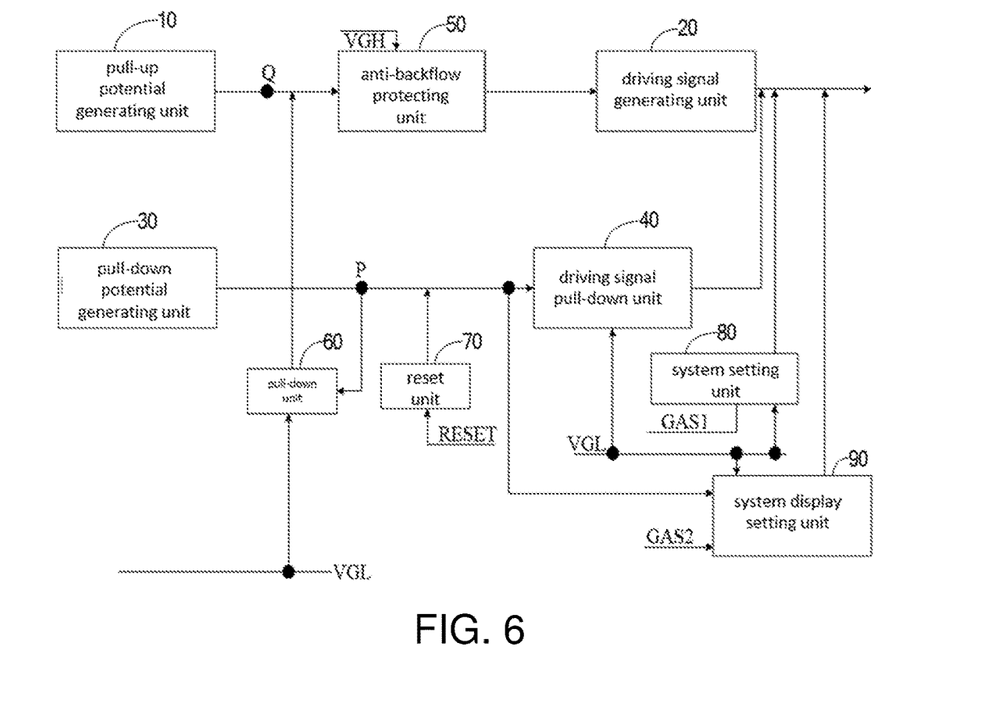
FIG. 6 is a sixth schematic structural diagram of the driving circuit provided by the embodiment of the present disclosure.

As shown in FIG. 6, in one of the embodiments, the Nth level driving sub-circuit further comprises a system display setting unit 90, a control terminal of the system display setting unit 90 is connected to a system display setting signal GAS2, an input terminal of the system display setting unit 90 is connected to the constant low potential signal VGL, and an output terminal of the system display setting unit 90 is connected to the output terminal of the pull-down potential generating unit 30 and the output terminal of the driving signal generating unit 30.

Specifically, the system display setting unit 90 is used to pull up the display drive signal G (N) according to the system display setting signal GAS2 and pull down the pull-down potential signal P to ensure that the display drive signal G (N) is at a high potential. The system display setting signal GAS2 is shared with the entire drive circuit; that is, the system display setting signal GAS2 can perform a system display setting for all levels of the drive sub-circuits in the entire drive circuit at the same time.

Wherein, as shown in FIG. 8, the system display setting unit 90 comprises a twenty-second thin film transistor T22 and a twenty-third thin film transistor T23. The system display setting signal GAS2 is connected to a gate of the twenty-second thin film transistor T22, a drain of the twenty-second thin film transistor T22, and a gate of the twenty-third thin film transistor T23. A source of the twenty-second thin film transistor T22 is connected to the source of the fifth thin film transistor T5, a drain of the twenty-third thin film transistor T23 is connected to the constant low potential signal VGL, and a source of the twenty-third thin film transistor T23 is connected to the first terminal of the second capacitor C2.

Figure 7:
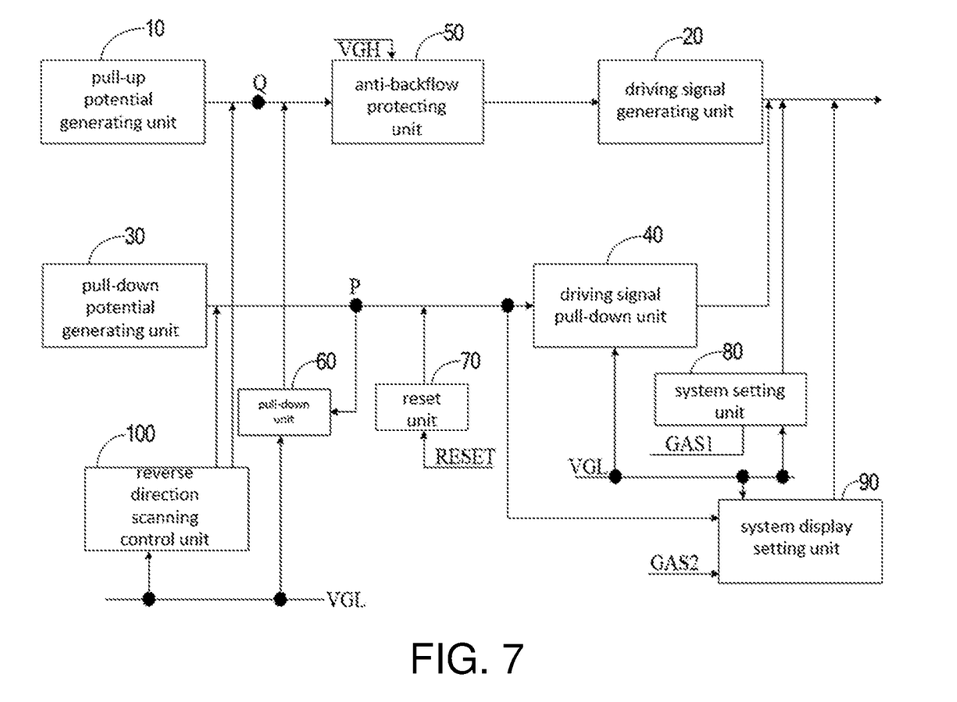
FIG. 7 is a seventh schematic structural diagram of the driving circuit provided by the embodiment of the present disclosure.

As shown in FIG. 7, in one of the embodiments, the Nth level driving sub-circuit further comprises a reverse scanning control unit, the reverse scanning control unit is connected to the constant low potential signal VGL, the pull-up potential generating unit 10, and the pull-down potential generating unit 30.

Specifically, the reverse scanning control unit 100 is used to control scanning directions of the driving circuit. The scanning directions comprises a forward scanning and a reverse scanning. The reverse scanning control unit 100 provided by the present embodiment is used to achieve the reverse scanning.

Wherein, as shown in FIG. 8, the reverse scanning control unit 100 comprises a twenty-fourth thin film transistor T24, a twenty-fifth thin film transistor T25, and a twenty-sixth thin film transistor T26. A reverse scanning control signal D2U is connected to a gate of the twenty-fourth thin film transistor T24 and a drain of the twenty-fifth thin film transistor T25. An (N−1)th level gate control signal CG(N−1) is connected to a drain of the twenty-fourth thin film transistor T24, and a source of the twenty-fourth thin film transistor T24 is connected to the source of the eleventh thin film transistor T11. An (N+2)th level gate control signal CG(N+2) is connected to the gate of the twenty-fifth thin film transistor T25, and a source of the twenty-fifth thin film transistor T25 is connected to a gate of the twenty-sixth thin film transistor T26 and the first terminal of the first capacitor C1. A source of the twenty-sixth thin film transistor T26 is connected to the first terminal of the second capacitor C2, and a drain of the twenty-sixth thin film transistor T26 is connected to the constant low potential signal VGL.

Figure 9:
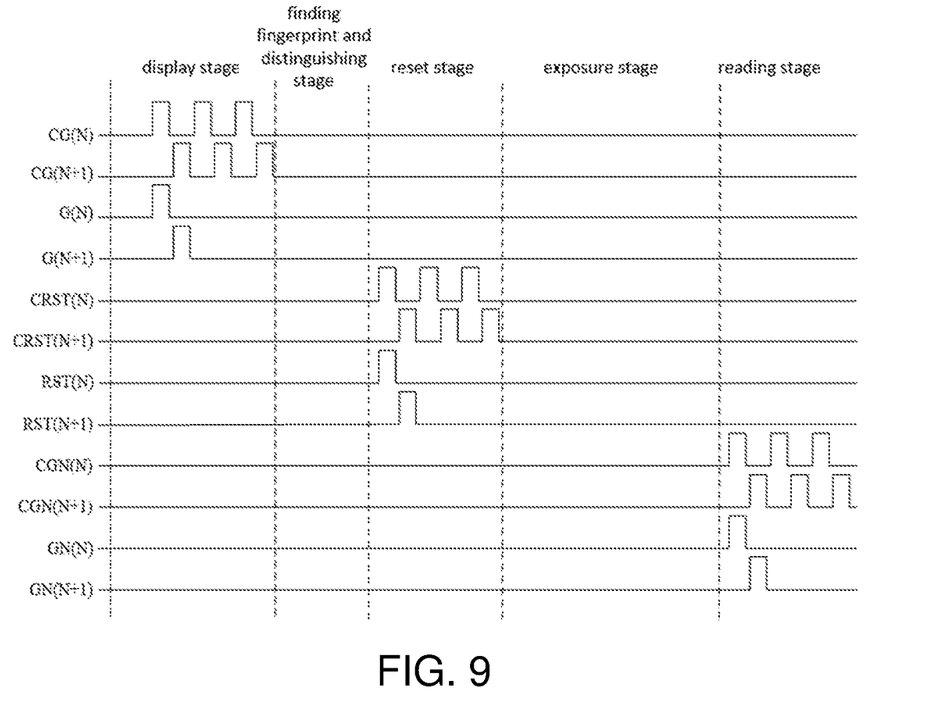
FIG. 9 is a timing diagram of the driving circuit shown in FIG. 8.

As shown in FIG. 8 and FIG. 9, working processes of the driving circuit comprise a display stage, a finding fingerprint and distinguishing stage, a reset stage, an exposure stage, and a reading stage. They are independent and do not interfere with each other, and they do not overlap in time.

The display stage: When any of the (N−2)th level gate control signal CG(N−2), the (N−2)th level fingerprint reset control signal CRST(N−2), or the (N−2)th level fingerprint control signal CGN(N−2) is on duty, one of the corresponding first thin film transistor T1, the corresponding second thin film transistor T2, or the corresponding third thin film transistor T3 will be turned on. At the same time, the fourth thin film transistor T4 will be turned on to pull up the potential of the pull-up signal Q. Therefore, the fifth thin film transistor T5, the sixth thin film transistor T6, and the seventh thin film transistor T7 are controlled to be in an on state, and the Nth level gate control signal CG(N) is output through the fifth thin film transistor T5 as the display driving signal G(N).

The finding fingerprint and distinguishing stage: When corresponding signals are all low-potential signals, the drive circuit has no output to cooperate with fingerprint recognition circuits to perform the finding fingerprint and distinguishing.

The reset stage: The Nth level fingerprint reset control signal CRST(N) is output through the sixth thin film transistor T6, and is used as the fingerprint reset signal to control the fingerprint recognition circuits to reset.

The exposure stage: When corresponding signals are low-potential signals, the drive circuit has no output to cooperate with the fingerprint recognition circuits for exposure.

The reading stage: The Nth level fingerprint control signal CGN(N) is output through the seventh thin film transistor T7, and is used as the Nth level fingerprint enable signal to control the fingerprint recognition circuits to read fingerprint data.

As shown in FIG. 8, in one of the embodiments, the fingerprint driving signals comprise the fingerprint reset signal RST(N) and the fingerprint enable signal GN(N). The fingerprint reset signal RST(N) is used to control the fingerprint recognition circuits to reset, and the fingerprint enable signal GN(N) is used to control the fingerprint recognition circuits to output a fingerprint recognition signal.

Figure 10:
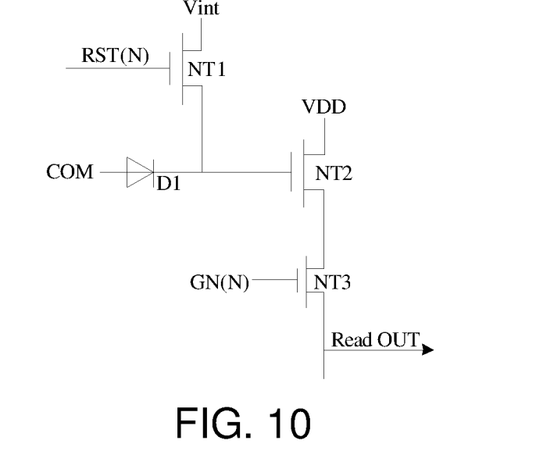
FIG. 10 is a schematic circuit diagram of fingerprint recognition circuits provided by the embodiment of the present disclosure.

Specifically, as shown in FIG. 10, the fingerprint recognition circuits comprise a plurality of fingerprint recognition sub-circuits, wherein an Nth fingerprint recognition sub-circuit comprises a twenty-seventh thin film transistor NT1, a twenty-eighth thin film transistor NT2, a twenty-ninth thin film transistor NT3, and a photodiode D1. A direct voltage signal Vint is connected to a drain of the twenty-seventh thin film transistor NT1, and the Nth level fingerprint reset signal is connected to a gate of the twenty-seventh thin film transistor NT1. A common voltage signal COM is connected to a positive electrode of the photodiode D1, and a negative electrode of the photodiode D1 is connected to a source of the twenty-seventh thin film transistor NT1 and a gate of the twenty-eighth thin film transistor NT2. A constant voltage signal VDD is connected to a drain of the twenty-eighth thin film transistor NT2, and a source of the twenty-eighth thin film transistor NT2 is connected to a drain of the twenty-ninth thin film transistor NT3. The Nth level fingerprint enable signal is connected to a gate of the twenty-ninth thin film transistor NT3, and a drain of the twenty-ninth thin film transistor NT3 is used to connect to a fingerprint recognition integrated circuit.

Wherein, the twenty-seventh thin film transistor NT1 is mainly used to reset fingerprint signals. When the Nth level fingerprint reset signal is at a high potential, the twenty-seventh thin film transistor NT1 is turned on, so that a potential of the negative electrode of the photodiode D1 in the corresponding fingerprint recognition sub-circuit is reset to a fixed voltage which is a potential of the direct voltage signal Vint.

Then, an exposure process is performed. The photodiode D1 generates a photo-generated current, which reduces the potential of the negative electrode of photodiode D1. Due to differences in reflectivity of valleys and ridges of fingerprints and differences in photogenerated currents, the potentials of the negative electrode of the photodiode D1 of pixels located in the valleys and ridges are different.

Finally, a reading process is performed. The constant voltage signal VDD, when the Nth level fingerprint enable signal is at a high potential, the twenty-ninth thin film transistor NT3 is turned on and a reading circuit is turned on. Due to differences between the potentials of the negative electrode of the photodiode D1 located in the valleys and ridges, a voltage difference (Vgs) between the gate and the source of the twenty-eighth thin film transistor NT2 is different. Therefore, corresponding currents are different, and an amount of electric charge or voltage difference read by the fingerprint recognition integrated circuit is different, thereby identifying the valleys or ridges of the fingerprints.

In one of the embodiments, the present disclosure provides a display panel comprising the driving circuit 3 in any of the above embodiments.

Figure 11:
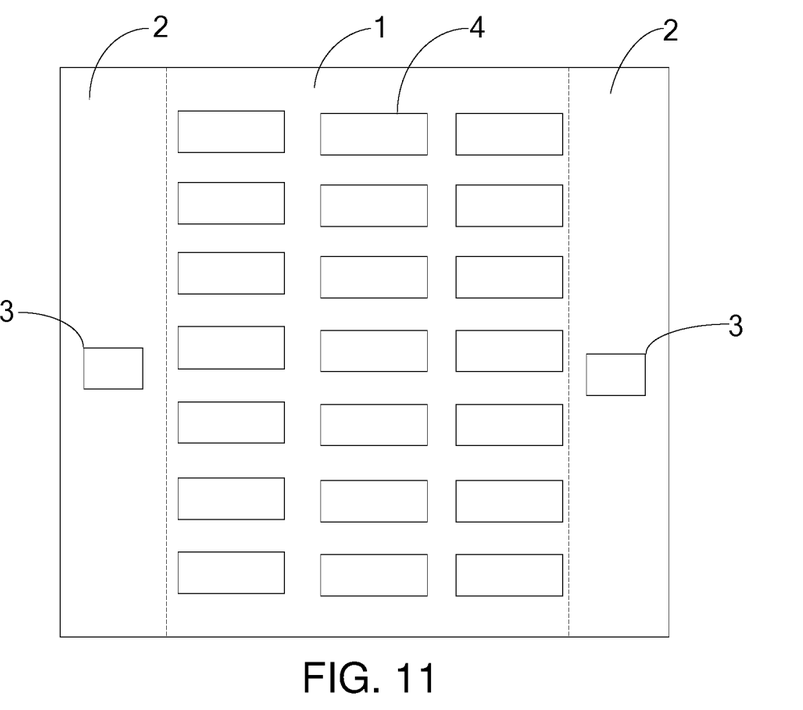
FIG. 11 is a schematic structural diagram of a display panel provided by the embodiment of the present disclosure.

As shown in FIG. 11, in one of the embodiments, the display panel also comprises a fingerprint recognition circuit 4 integrated in the display panel, a control terminal of the fingerprint recognition circuit 4 is connected to an output terminal of the driving circuit 3 to connect to the fingerprint driving signal.

As shown in FIG. 11, in one of the embodiments, the display panel comprises a display region 1 and border regions 2 on left and right sides of the display region 1. The border regions 2 comprise a left border region and a right border region. A gate line is disposed in the display panel, and the fingerprint recognition circuit 4 is located in the display region 1 and is arranged in an array. The driving circuit 3 is located in the border regions 2, and one driving circuit 3 is respectively disposed in the left border region and the right border region. Wherein, two terminals of an Nth level gate line are respectively connected to corresponding Nth level driving sub-circuit, which may realize two driving sub-circuits to drive same gate line at the same time, improving driving capability of the gate line and reducing delay degree of a gate driving signal.

It should be understood that for those of ordinary skill in the art, equivalent replacements or changes can be made according to technical solutions of the present disclosure and its inventive concept, and all these changes or replacements should fall within the protection scope of the claims attached to the present disclosure.

What is claimed is:

1. A driving circuit, comprising multilevel cascading driving sub-circuits, wherein an Nth level driving sub-circuit comprises:
   a pull-up potential generating unit used to generate a pull-up potential signal;
   a driving signal generating unit connected to an output terminal of the pull-up potential generating unit, which is used to separately output a display driving signal and fingerprint driving signals according to the pull-up potential signal in a different timing;
   a pull-down potential generating unit used to generate a pull-down potential signal; and
   a driving signal pull-down unit connected to an output terminal of the pull-down potential generating unit and an output terminal of the driving signal generating unit, which is used to control the driving signal pull-down unit according to the pull-down potential signal to pull down a potential of the display driving signal and a potential of the fingerprint driving signals;
   wherein the fingerprint diving signals comprise a fingerprint reset signal and a fingerprint enable signal, the fingerprint reset signal is used to control fingerprint recognition circuits to reset, and the fingerprint enable signal is used to control the fingerprint recognition circuits to output a fingerprint recognition signal.

2. The driving circuit as claimed in claim 1, wherein the Nth level driving sub-circuit comprises an anti-backflow protection unit, an input terminal of the anti-backflow protection unit is connected to the output terminal of the pull-up potential generating unit, an output terminal of the anti-backflow protection unit is connected to an input terminal of the driving signal generating unit, and a control terminal of the anti-backflow protection unit is connected to a constant high potential signal.

3. The driving circuit as claimed in claim 2, wherein the Nth level driving sub-circuit comprises a pull-down unit, an input terminal of the pull-down unit is connected to a constant low potential signal, an output terminal of the pull-down unit is connected to the output terminal of the pull-up potential generating unit, and a control terminal of the pull-down unit is connected to the output terminal of the pull-down potential generating unit.

4. The driving circuit as claimed in claim 3, wherein the Nth level driving sub-circuit comprises a reset unit, a system reset signal is connected to an input terminal of the reset unit and a control terminal of the reset unit, and an output terminal of the reset unit is connected to the output terminal of the pull-down potential generating unit.

5. The driving circuit as claimed in claim 4, wherein the Nth level driving sub-circuit comprises a system setting unit, a system setting signal is connected to a control terminal of the system setting unit, an input terminal of the system setting unit is connected to the constant low potential signal, and an output terminal of the system setting unit is connected to the output terminal of the driving signal generating unit.

6. The driving circuit as claimed in claim 5, wherein the Nth level driving sub-circuit comprises a system display setting unit, a control terminal of the system display setting unit is connected to a system display setting signal, an input terminal of the system display setting unit is connected to the constant low potential signal, and an output terminal of the system display setting unit is connected to the output terminal of the pull-down potential generating unit and the output terminal of the driving signal generating unit.

7. The driving circuit as claimed in claim 6, wherein the Nth level driving sub-circuit further comprises a reverse scanning control unit, and the reverse scanning control unit is connected to the constant low potential signal, the pull-up potential generating unit, and the pull-down potential generating unit.

8. The driving circuit as claimed in claim 3, wherein the pull-up potential generating unit comprises a first thin film transistor, a second thin film transistor, a third thin film transistor, a fourth thin film transistor, and a first capacitor;
   the constant high potential signal is connected to a drain of the first thin film transistor, a drain of the second thin film transistor, and a drain of the third thin film transistor;
   an (N−2)th level gate control signal is connected to a gate of the first thin film transistor, an (N−2)th level fingerprint reset control signal is connected to a gate of the second thin film transistor, and an (N−2)th level fingerprint control signal is connected to a gate of the third thin film transistor;
   a gate of the fourth thin film transistor is connected to a source of the first thin film transistor, a source of the second thin film transistor, and a source of the third thin film transistor; and
   a forward scanning control signal is connected to a drain of the fourth thin film transistor, a source of the fourth thin film transistor is connected to a first terminal of the first capacitor, and a second terminal of the first capacitor is connected to the constant low potential signal.

9. The driving circuit as claimed in claim 8, wherein the driving signal generating unit comprises a fifth thin film transistor, a sixth thin film transistor, and a seventh thin film transistor;

the first terminal of the first capacitor is connected to a gate of the fifth thin film transistor, a gate of the sixth thin film transistor, and a gate of the seventh thin film transistor;

an Nth level gate control signal is connected to a drain of the fifth thin film transistor, and a source of the fifth thin film transistor is used to output the display driving signal;

an Nth level fingerprint reset control signal is connected to a drain of the sixth thin film transistor, and a source of the sixth thin film transistor is used to output the fingerprint reset signal of the fingerprint driving signals; and an Nth level fingerprint control signal is connected to a drain of the seventh thin film transistor, and a source of the seventh thin film transistor is used to output the fingerprint enable signal of the fingerprint driving signals.

10. The driving circuit as claimed in claim 9, wherein the pull-down potential generating unit comprises an eighth thin film transistor, a ninth thin film transistor, a tenth thin film transistor, an eleventh thin film transistor, a twelfth thin film transistor, and a second capacitor;

the constant high potential signal is connected to a drain of the eighth thin film transistor, a drain of the ninth thin film transistor, and a drain of the tenth thin film transistor;

an (N+1)th level gate control signal is connected to a gate of the eighth thin film transistor, an (N+1)th level fingerprint reset control signal is connected to a gate of the ninth thin film transistor, and an (N+1)th level fingerprint control signal is connected to a gate of the tenth thin film transistor;

a drain of the eleventh thin film transistor is connected to a source of the eighth thin film transistor, a source of the ninth thin film transistor, and a source of the tenth thin film transistor, the forward scanning control signal is connected to a gate of the eleventh thin film transistor, and a source of the eleventh thin film transistor is connected to a gate of the twelfth thin film transistor; and the constant high potential signal is connected to a drain of the twelfth thin film transistor, a source of the twelfth thin film transistor is connected to a first terminal of the second capacitor, and a second terminal of the second capacitor is connected to the constant low potential signal.

11. The driving circuit as claimed in claim 10, wherein the driving signal pull-down unit comprises a thirteenth thin film transistor, a fourteenth thin film transistor, and a fifteenth thin film transistor;

the first terminal of the second capacitor is connected to a gate of the thirteenth thin film transistor, a gate of the fourteenth thin film transistor, and a gate of the fifteenth thin film transistor; and a source of the thirteenth thin film transistor is connected to the source of the fifth thin film transistor, a source of the fourteenth thin film transistor is connected to the source of the sixth thin film transistor, a source of the fifteenth thin film transistor is connected to the source of the seventh thin film transistor, and a constant low potential signal is connected to a drain of the thirteenth thin film transistor, a drain of the fourteenth thin film transistor, and a drain of the fifteenth thin film transistor.

12. The driving circuit as claimed in claim 11, wherein the anti-backflow protection unit comprises a sixteenth thin film transistor, the first terminal of the first capacitor is connected to a drain of the sixteenth thin film transistor, a source of the sixteenth thin film transistor is connected to the gate of the fifth thin film transistor, and a gate of the sixteenth thin film transistor is connected to the constant high potential signal.

13. The driving circuit as claimed in claim 12, wherein the pull-down unit comprises a seventeenth thin film transistor, the first terminal of the second capacitor is connected to a gate of the seventeenth thin film transistor, a source of the seventeenth thin film transistor is connected to the first terminal of the first capacitor, and a drain of the seventeenth thin film transistor is connected to the constant low potential signal.

14. The driving circuit as claimed in claim 13, wherein the reset unit comprises an eighteenth thin film transistor, the system reset signal is connected to a drain of the eighteenth thin film transistor and a gate of the eighteenth thin film transistor, and a source of the eighteenth thin film transistor is connected to the first terminal of the second capacitor.

15. The driving circuit as claimed in claim 14, wherein the system setting unit comprises a nineteenth thin film transistor, a twentieth thin film transistor, and a twenty-first thin film transistor;

the system setting signal is connected to a gate of the nineteenth thin film transistor, a gate of the twentieth thin film transistor, and a gate of the twenty-first thin film transistor;

a source of the nineteenth thin film transistor is connected to the source of the fifth thin film transistor, a source of the twentieth thin film transistor is connected to the source of the sixth thin film transistor, and a source of the twenty-first thin film transistor is connected to the source of the seventh thin film transistor; and the constant low potential signal is connected to a drain of the nineteenth thin film transistor, a drain of the twentieth thin film transistor, and a drain of the twenty-first thin film transistor.

16. The driving circuit as claimed in claim 15, wherein the system display setting unit comprises a twenty-second thin film transistor and a twenty-third thin film transistor;

the system display setting signal is connected to a gate of the twenty-second thin film transistor, a drain of the twenty-second thin film transistor, and a gate of the twenty-third thin film transistor; and a source of the twenty-second thin film transistor is connected to the source of the fifth thin film transistor, a drain of the twenty-third thin film transistor is connected to the constant low potential signal, and a source of the twenty-third thin film transistor is connected to the first terminal of the second capacitor.

17. The driving circuit as claimed in claim 16, wherein the reverse scanning control unit comprises a twenty-fourth thin film transistor, a twenty-fifth thin film transistor, and a twenty-sixth thin film transistor;

a reverse scanning control signal is connected to a gate of the twenty-fourth thin film transistor and a drain of the twenty-fifth thin film transistor;

an (N−1)th level gate control signal is connected to a drain of the twenty-fourth thin film transistor, and a source of the twenty-fourth thin film transistor is connected to the source of the eleventh thin film transistor;

an (N+2)th level gate control signal is connected to the gate of the twenty-fifth thin film transistor, and a source of the twenty-fifth thin film transistor is connected to a gate of the twenty-sixth thin film transistor and the first terminal of the first capacitor; and a source of the twenty-sixth thin film transistor is connected to the first terminal of the second capacitor, and
a drain of the twenty-sixth thin film transistor is connected to the constant low potential signal.

18. A display panel, comprising the driving circuit as claimed in claim 1.

19. The display panel as claimed in claim 18, wherein the display panel comprises fingerprint recognition circuits integrated in the display panel, and a control terminal of the fingerprint recognition circuits is connected to an output terminal of the driving circuit to connect to the fingerprint driving signals.

* * * * *